US006562680B1

(12) United States Patent
Asakawa (10) Patent No.: US 6,562,680 B1
(45) Date of Patent: May 13, 2003

(54) SEMICONDUCTOR DEVICE AND METHOD OF MANUFACTURING THE SAME

(75) Inventor: Keiko Asakawa, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/688,683

(22) Filed: Oct. 17, 2000

(30) Foreign Application Priority Data

Nov. 17, 1999 (JP) ............................................ 11-327119

(51) Int. Cl.$^7$ ............................................. H01L 21/336
(52) U.S. Cl. ...................... 438/257; 438/303; 438/230; 438/585
(58) Field of Search ................................. 438/257, 303, 438/230, 232, 585, 586, 287, 664, 682, 683, 902, FOR 193, FOR 360, FOR 196

(56) References Cited

U.S. PATENT DOCUMENTS

| 5,338,700 | A | * | 8/1994 | Dennison et al. ............ 438/253 |
| 5,661,052 | A | * | 8/1997 | Inoue et al. |
| 5,686,331 | A | * | 11/1997 | Song ........................... 438/303 |
| 6,251,727 | B1 | * | 6/2001 | Chen ........................... 438/257 |

FOREIGN PATENT DOCUMENTS

JP 11-17181 1/1999

OTHER PUBLICATIONS

Patent Abstracts of Japan Publication No. 11017181, published Jan. 22, 1999.

* cited by examiner

Primary Examiner—Olik Chaudhuri
Assistant Examiner—Thanh V Pham
(74) Attorney, Agent, or Firm—Nixon & Vanderhye P.C.

(57) ABSTRACT

A method of manufacturing a semiconductor device comprising the steps of: (a) depositing a gate insulating film, a floating gate silicon film, an insulating film between gates, and a control gate silicon film in this order on a silicon substrate and forming thereon a third insulating film; (b) etching said films until the silicon substrate is exposed to form a gate electrode and to open regions for a source and a drain; (c) removing the third insulating film while leaving it on one end or both ends of the gate electrode in the direction of channel length so that the control gate silicon film is partially exposed; (d) forming sidewall spacers on sidewalls of the gate electrode and the third insulating film remaining on the gate electrode; (e) depositing a refractory metal film over the entire surface; and (f) performing a thermal treatment for simultaneous silicidation of the refractory metal film with the exposed control gate silicon film and the silicon substrate to form a metal silicide layer on each of the exposed control gate silicon film and the silicon substrate.

8 Claims, 13 Drawing Sheets

SEMICONDUCTOR DEVICE AND METHOD OF MANUFACTURING THE SAME

CROSS-REFERENCE TO RELATED APPLICATION

This application is related to Japanese application No. HEI 11 (1999)-327119 filed on Nov. 17, 1999, whose priority is claimed under 35 USC §119, the disclosure of which is incorporated by reference in its entirety.

BACKGROUND OF THE INVENTION

1. Field of the Invention

The present invention relates to a semiconductor device and a method of manufacturing the same. More specifically, it relates to a method of manufacturing a nonvolatile semiconductor memory, which is one kind of semiconductor device, particularly utilizing a self-aligned silicidation (SALICIDE) technique and a self-aligned contact (SAC) technique.

2. Description of Related Art

In semiconductor devices, the size reduction of contact holes and the junction of diffusion layers in a shallow region tend to occur due to miniaturization of the devices, which leads to the increase in contact resistance and parasitic resistance. A self-aligned silicide technique has been utilized as means of decreasing the contact resistance and the parasitic resistance. According to the technique, a metal film is deposited on a silicon region where electrical conduction is required, the metal is annealed to form sillcide and then unreacted metal is removed so that only the silicide remains. A common self-aligned silicide technique according to the prior art will be explained hereinafter.

Figure 15A:
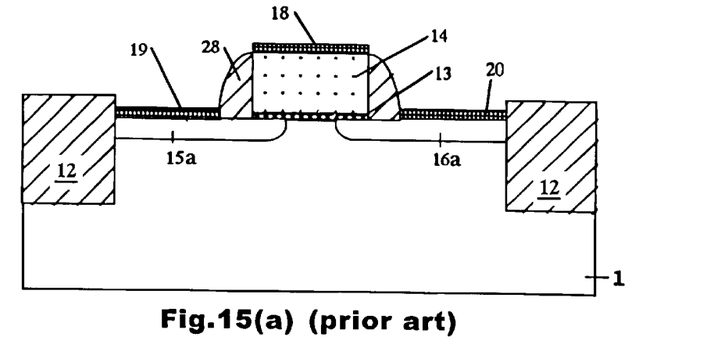
FIGS. 15(a) to 15(c) are schematic sectional views for illustrating steps and drawbacks of a self-aligned silicide technique according to the prior art.
Figure 15B:
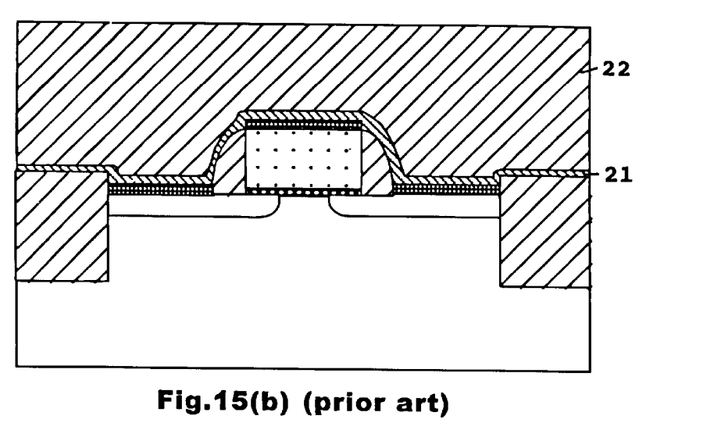
Figure 15C:
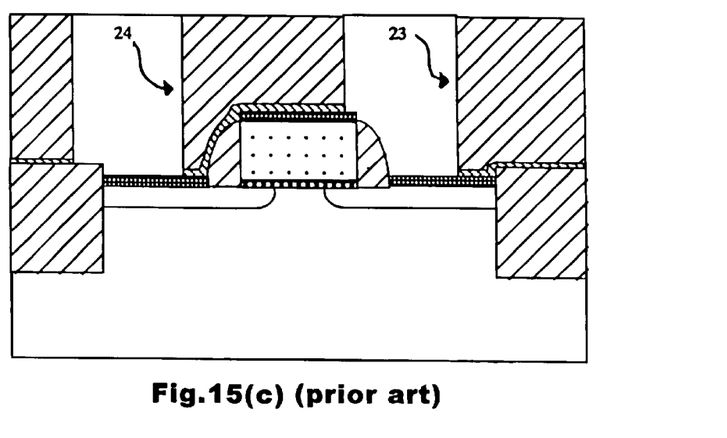

FIGS. 15(a) to 15(c) show an example of the self-aligned silicide technique applied to the production of a MOS transistor.

As shown in FIG. 15(a), a gate electrode 14 is formed with the intervention of a gate insulating film 13 on an active region defined between device isolation regions 12 formed in a silicon substrate 1. On both sides of the gate electrode 14, high concentration diffusion layers are formed in the silicon substrate 1 to serve as a source 15a and a drain 16a, respectively. Further, sidewall spacers 28 are formed on the sidewalls of the gate electrode 14. On the silicon substrate 1 including the thus constructed gate electrode, a metal film (cobalt, titanium or the like) is deposited and thermally treated for silicidation. Then, unreacted metal film is removed to complete metal silicide layers 18, 19 and 20 on the gate electrode 14, the source 15a and the drain 16a, respectively. According to this method, the bottom of the metal silicide layer 18 is located higher than the top of the sidewall spacers 28.

In another aspect, it is getting difficult to arrange a great distance between the contact and the gate electrode as the semiconductor devices are further miniaturized. Accordingly, a self-aligned contact technique has been proposed, in which a film different in material from the interlayer insulating film is formed on the top and the sidewalls' of the gate electrode to prevent the gate electrode from coming into contact with or getting closer to the contact. A number of variations of the technique have been known, among which a method utilizing a silicon nitride film as an etch stop layer is studied in detail.

For the self-aligned contact formation according to the method, after the metal silicide film 18 is formed, a silicon nitride film 21 is deposited on the silicon substrate 1 to cover the gate electrode 14. Then an interlayer insulating film 22 of a silicon oxide film is deposited thereon (FIG. 15(b)). Photolithography method and etching method are then performed to open contact holes 23 and 24 in the interlayer insulating film 22. This etching process is performed to selectively remove the interlayer insulating film 22 until the top of the silicon nitride film 21, which serves as the etch stop film, is exposed, and then to selectively remove the silicon nitride film 21 until the top of the metal silicide film is exposed (FIG. 15(c)).

Figure 16A:
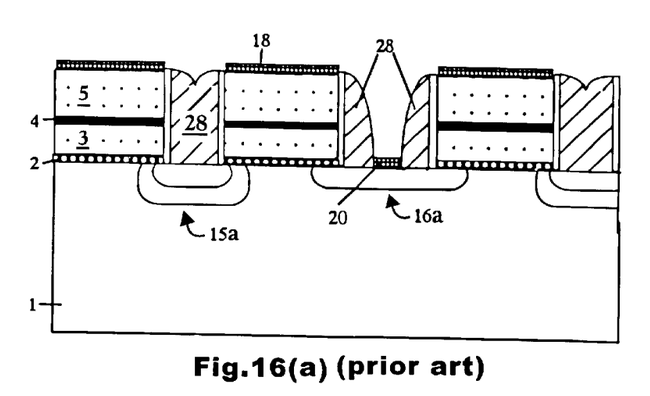
FIGS. 16(a) to 16(c) are schematic sectional views for illustrating steps and drawbacks of a self-aligned contact technique according to the prior art.
Figure 16B:
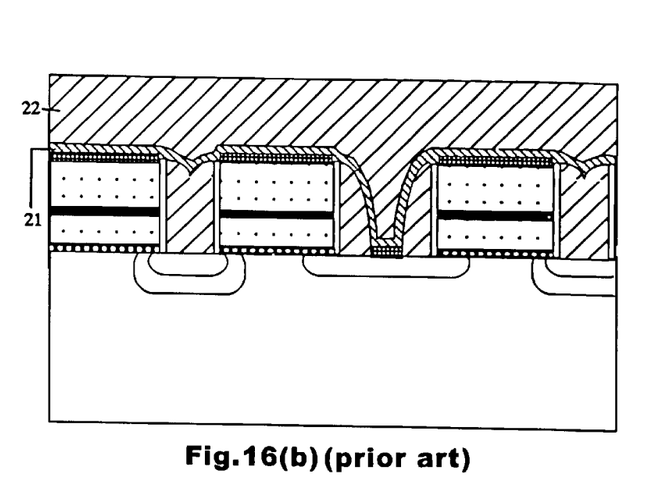
Figure 16C:
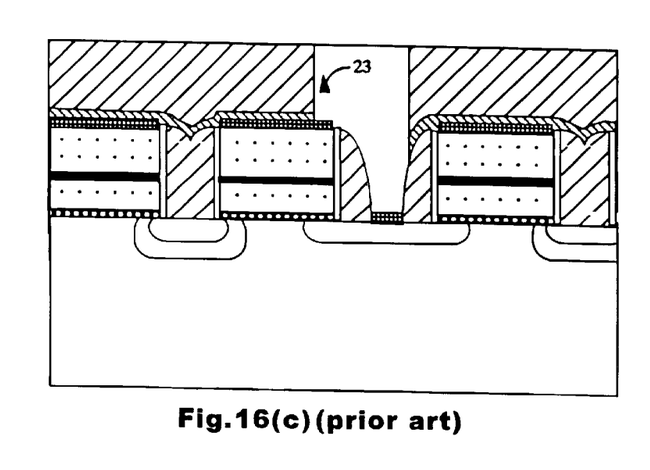

In the above, the self-aligned silicide technique and the self-aligned contact technique are applied to form a common MOS transistor. FIGS. 16(a) to 16(c) show sectional views cut along a bit line of a nonvolatile semiconductor memory for illustrating manufacturing processes according to the same techniques. FIGS. 16(a) to 16(c) correspond to FIGS. 15(a) to 15(c). In FIGS. 16(a) to 16(c), reference numeral 2 denotes a gate insulating film, 3 a floating gate silicon film, 4 an insulating film of an ONO film formed between the gates and 5 a control gate silicon film.

However, in the conventional self-aligned contact technique, if the contact hole is mal-aligned and formed above a sidewall spacer arranged on a sidewall of the gate electrode, the distance between a contact part to be formed in the contact hole and the gate electrode (in particular a silicide portion) is reduced and as a result, dielectric strength therebetween tends to decrease.

To solve such a problem, Japanese Unexamined Patent Publication No. HEI 11 (1999)-17181 discloses a method utilizing both the self-aligned silicide (SALICIDE) technique and the self-aligned contact (SAC) technique, and at the same time inhibiting the decrease of the dielectric strength between the gate electrode and the contact part even if the contact holes are mal-aligned. This method will be explained with reference to FIGS. 17(a) to 17(e).

Figure 17A:
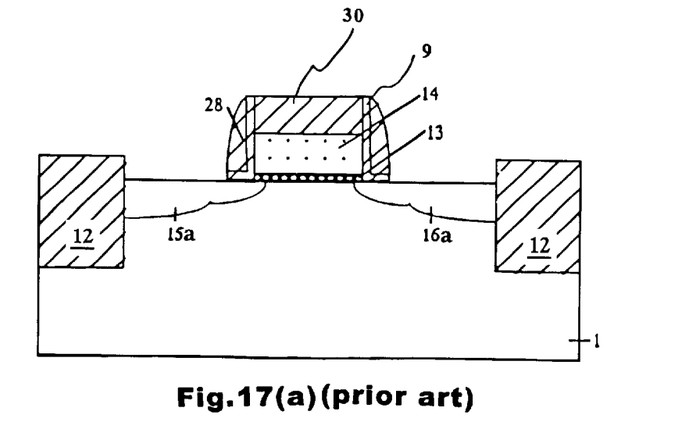
FIGS. 17(a) to 17(e) are schematic sectional views for illustrating steps of an improved manufacturing method utilizing both the self-aligned silicide technique and the self-aligned contact technique according to the prior art.
Figure 17B:
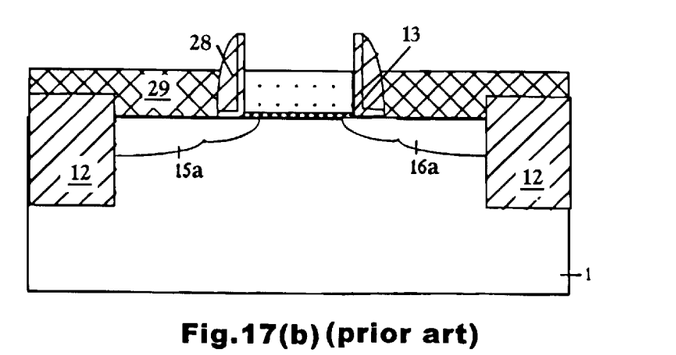

FIG. 17(a) shows a sectional view of a MOS transistor, in which reference numeral 9 denotes a thermal oxidization film and 30 an offset oxide film. A resist layer 29 is applied to the entire surface of the MOS transistor and etched back until the top surface of the offset oxide film 30 is exposed. Then, the offset oxide film 30 on the gate electrode 14 is selectively removed while leaving the unremoved resist layer 29 (FIG. 17(b)).

Figure 17C:
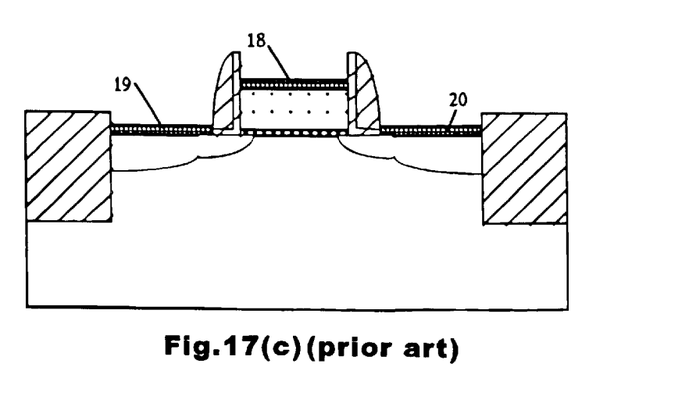
Figure 17D:
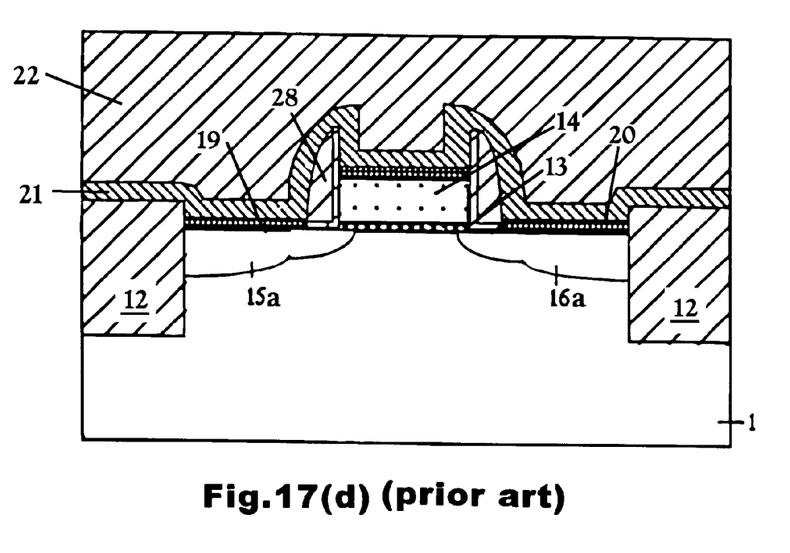

The gate electrode 14, the source 15a and the drain 16a are simultaneously subjected to silicidation (FIG. 17(c)). Then, a silicon nitride film 21 and an interlayer insulating film 22 are deposited over the entire surface (FIG. 17(d)), followed by the formation of contact holes 23 and 24 (FIG. 17(e)).

Figure 17E:
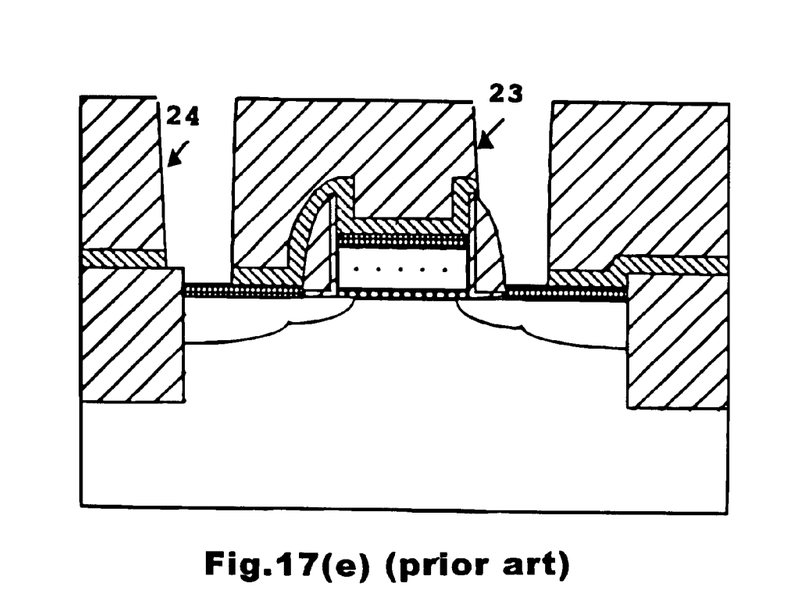

In the thus constructed MOS transistor, even if the contact holes 23 and 24 are mal-aligned, electrical conduction due to the swelling of the silicide can be inhibited by the offset oxide film 30 and the sidewall spacers 28 formed on the sidewalls thereof. Further, the reduction of the dielectric strength between the gate electrode 14 and the contact part can be prevented because of the presence of the silicon nitride film 21 on the gate electrode 14.

In the above, the method is utilized to form the MOS transistor, but it can also be applied to form a nonvolatile semiconductor memory by forming the floating gate silicon film 3, the insulating film 4 between the gates, the control gate silicon film 5 and the nitride film in this order on the gate insulating film 13 so that the control gate silicon film 5 serves as the gate electrode 14 and the nitride film serves as the offset oxide film 30.

However, as the memory cells are further miniaturized, the contact hole may be mal-aligned and situated above the gate electrode, which induces short circuit between the contact part in the diffusion region and the gate electrode.

Further, additional steps, i.e., the formation and etch back of the resist layer 29 and the removal of the offset oxide film must be performed.

Moreover, a masking step is also added to remove the insulating film for the silicidation of the surface of the control gate silicon film.

SUMMARY OF THE INVENTION

An object of the present invention is to inhibit the reduction of the dielectric strength between the gate electrode and the contact part in the diffusion region, without any additional step to remove the insulating film on the gate electrode separately.

Thus, according to the present invention, provided is a method of manufacturing a semiconductor device comprising the steps of:

(a) depositing a gate insulating film, a floating gate silicon film, an insulating film between gates, and a control gate silicon film in this order on a silicon substrate and forming thereon a third insulating film;

(b) etching said films until the silicon substrate is exposed to form a gate electrode and to open regions for a source and a drain;

(c) removing the third insulating film while leaving it on one end or both ends of the gate electrode in the direction of channel length so that the control gate silicon film is partially exposed;

(d) forming sidewall spacers on sidewalls of the gate electrode and the third insulating film remaining on the gate electrode;

(e) depositing a refractory metal film over the entire surface; and (f) performing a thermal treatment for simultaneous silicidation of the refractory metal film with the exposed control gate silicon film and the silicon substrate to form a metal silicide layer on each of the exposed control gate silicon film and the silicon substrate.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In view of the above problems, one of the features of the present invention is that an insulating film (third insulating film) removes while leaving it on one end or both ends of the gate electrode in the direction of channel length so that the control gate silicon film is partially exposed.

According to the feature, the contact part and the gate electrode (in particular the silicide portion) can be formed with a great distance therebetween. Even if the contact hole is mal-aligned and formed above the gate electrode, the reduction of the dielectric strength can be prevented since the third insulating film is formed on the gate electrode.

Further, the insulating film on the gate electrode can be removed simultaneously with the self-aligned source etching, which can prevent the complication of the manufacturing processes.

Figure 1:
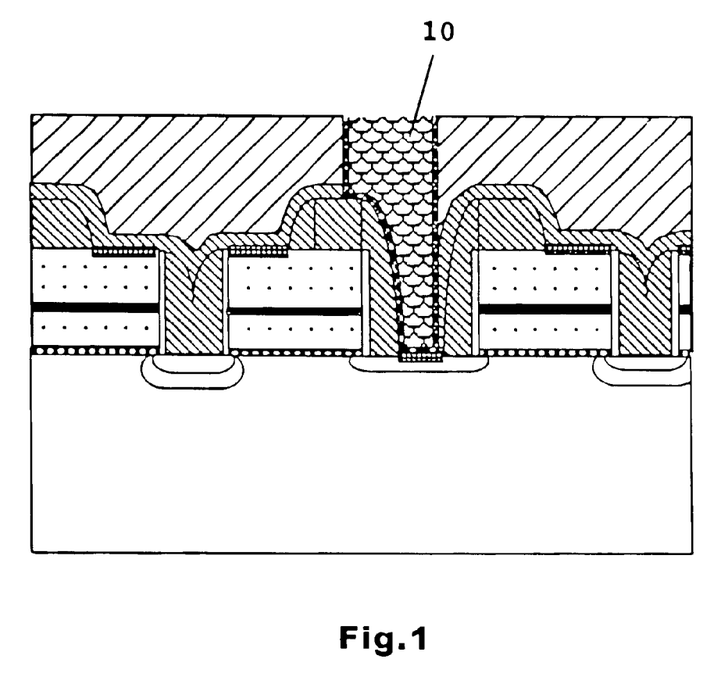
FIG. 1 is a schematic sectional view cut along a bit line for illustrating a semiconductor device which can be obtained by a manufacturing method according to the present invention.
Figure 13A:
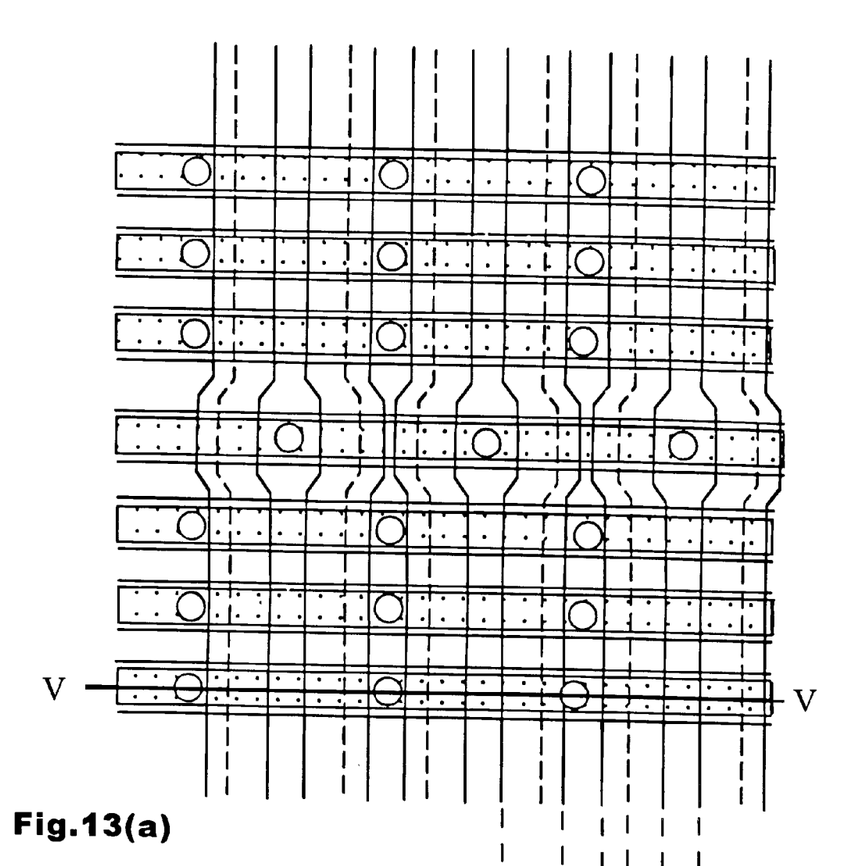
FIGS. 13(a) and 13(b) are plan views of the semiconductor device which can be obtained by the manufacturing method according to the present invention.
Figure 13B:
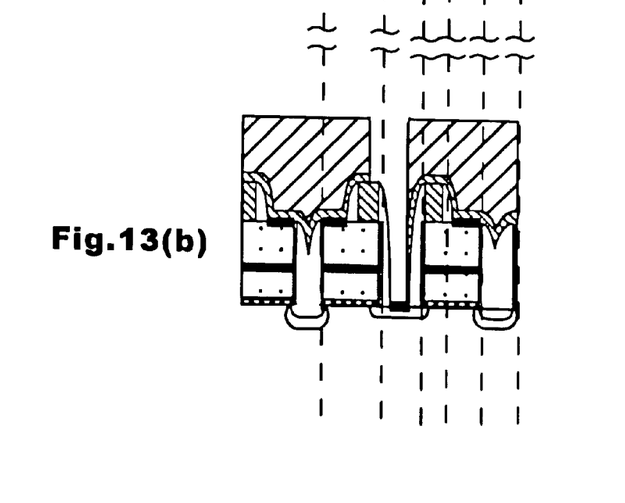

Hereinafter, the present invention will be explained in detail with reference to the drawings. FIGS. 1 and 13(a) illustrate a semiconductor device (array) comprising a plurality of cells which can be obtained according to the method of the present invention. FIG. 1 shows a sectional view cut along a bit line of the semiconductor device in which a tungsten plug 10 has been formed and FIG. 13(a) is a plan view of the semiconductor device. FIG. 13(b) is a sectional view corresponding to the plan view of FIG. 13(a).

The structure shown in FIGS. 1 and 13(a) can be obtained in the following manner.

Figure 2:
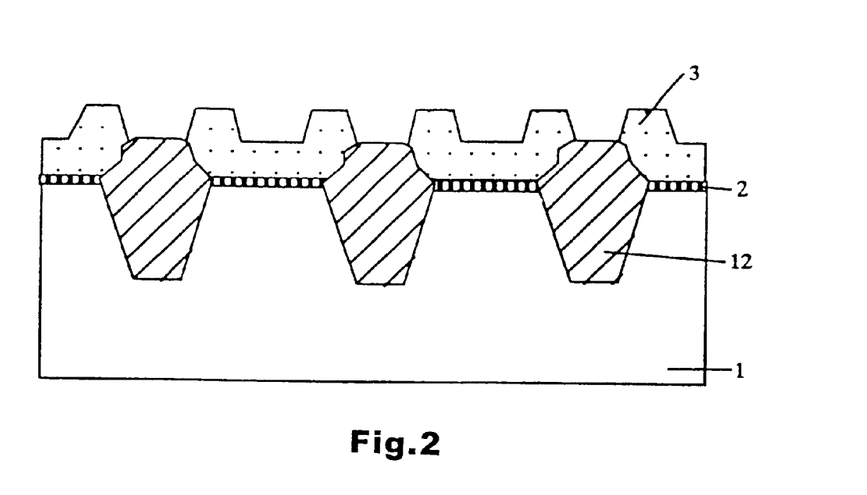
FIG. 2 is a schematic sectional view cut along a word line for illustrating a step of the manufacturing method of the semiconductor device according to the present invention.

As shown in FIG. 2, device isolation regions 12 are formed in a silicon substrate 1 by STI method. Each of the device isolation regions is made of a CVD silicon oxide film, for example. Then a gate insulating film 2 (a tunnel insulating film) is formed on the silicon substrate 1. The gate insulating film is made of a silicon oxide film of 8 to 10 nm thick, for example. A material layer for a floating gate silicon film is then deposited on the gate insulating film 2, doped with impurities such as phosphorus as required and subjected to photolithography and etching to form floating gate silicon films 3 that are parallel to each other in a certain direction (the direction of bit lines). Each of the floating gate silicon films 3 is made of a polycrystalline silicon layer of 100 to 200 nm thick, for example.

Successively, a material layer for an insulating film between the gates (for example, made of an ONO film: silicon oxide film—silicon nitride film—silicon oxide film) is deposited. Further, a material layer for a control gate silicon film is deposited thereon and impurities such as phosphorus as required are doped therein. The material layer for the control gate silicon film may be polycrystalline silicon, for example. Next, a material layer for a third insulating film, e.g., a silicon nitride film, is deposited on the deposited material for the control gate silicon film. Alternatively, a silicon oxide film may be deposited prior to the silicon nitride film so that a two-layered material layer for the third insulating film is formed.

Figure 3:
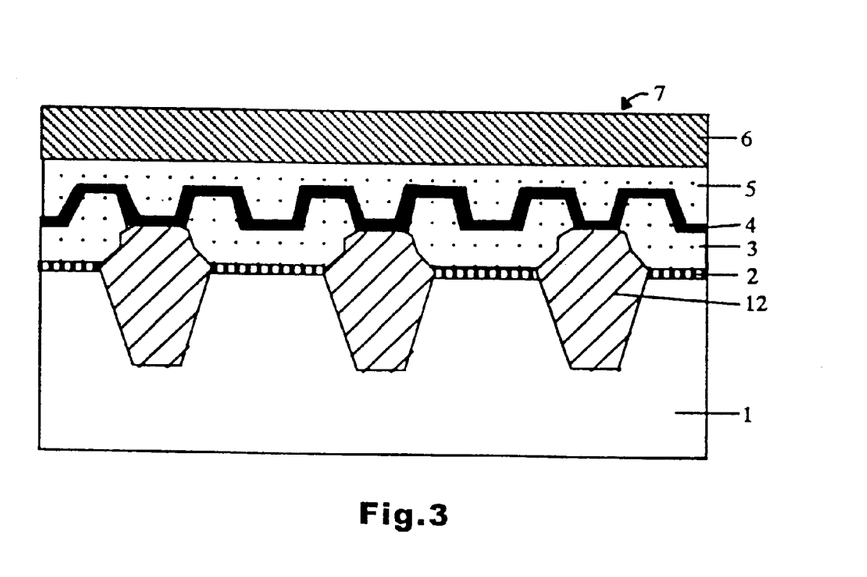
FIG. 3 is a schematic sectional view cut along the word line for illustrating a step of the manufacturing method of the semiconductor device according to the present invention.
Figure 4:
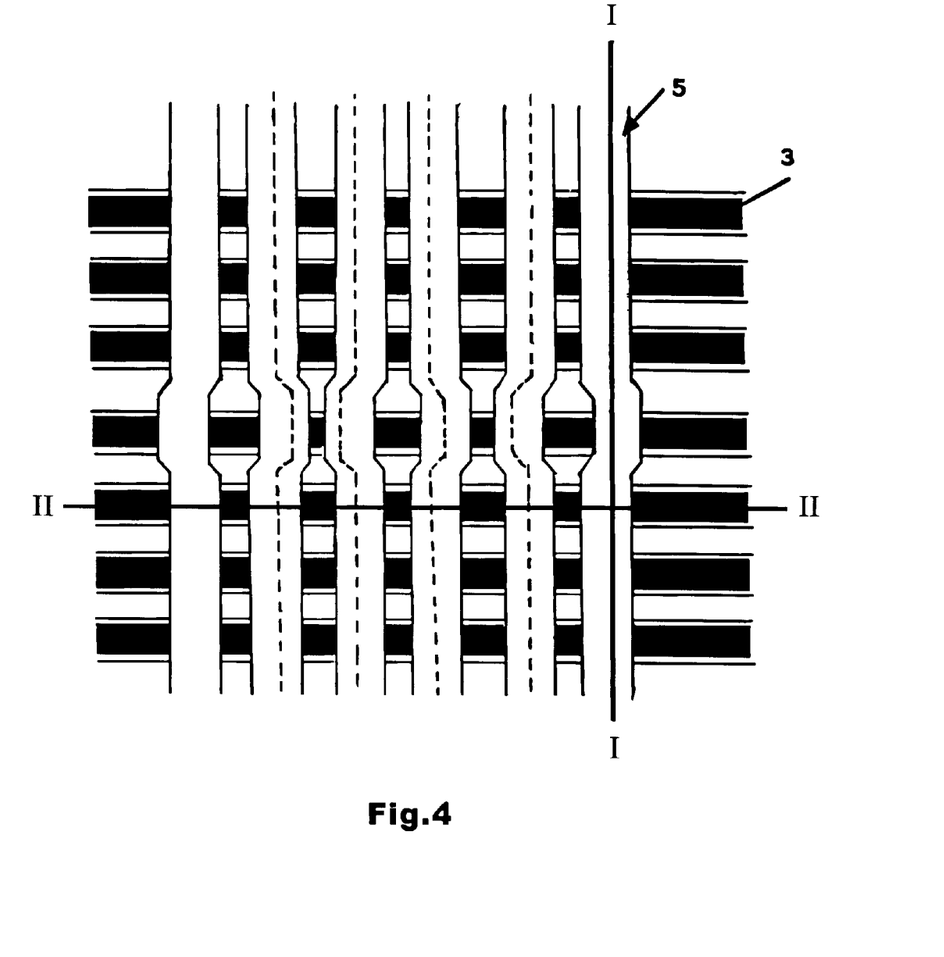
FIG. 4 is a schematic plan view of the semiconductor device for illustrating a step of the manufacturing method according to the present invention.
Figure 5:
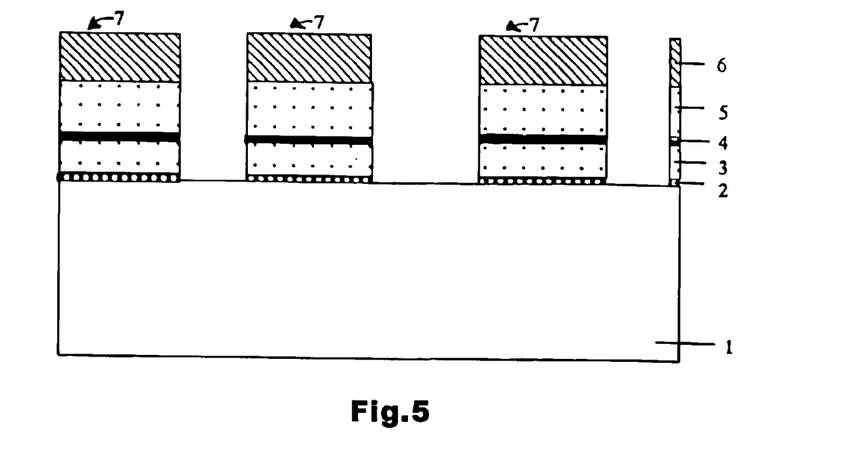
FIG. 5 is a schematic sectional view cut along the bit line for illustrating a step of the manufacturing method of the semiconductor device according to the present invention.

Then, resulting layers are patterned into the shape of the gate electrodes by photolithography and etching. In this etching process, the deposited material layers are subsequently etched into the third insulating films 6, the control gate silicon films 5 and the insulating films 4 between the gates, respectively (FIGS. 3 and 5). At the same time, the floating gate silicon films 3 orthogonal to the control gate silicon films 5 are also etched so that the floating gate silicon films 3 are formed into the size corresponding to the cells below the control gate silicon films 5. FIG. 3 is a sectional view cut along the word line and FIG. 5 is a sectional view cut along the bit line. FIG. 4 shows a plan view corresponding to FIGS. 3 and 5.

Thus, control lines 7 are obtained as shown in FIGS. 3 and 5 and rectangular floating gate regions are formed below the control gate silicon films 5.

Figure 6:
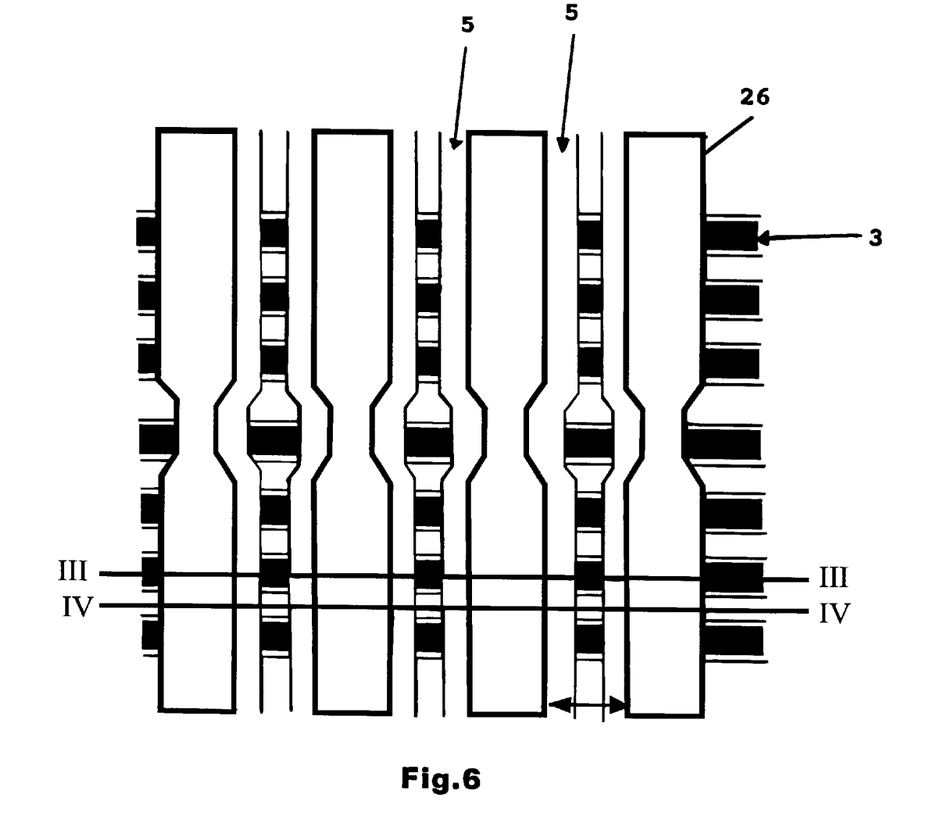
FIG. 6 is a schematic plan view of the semiconductor device for illustrating a step of the manufacturing method according to the present invention.

Next, a resist layer 26 of a desired pattern is formed to provide source lines. As shown in FIG. 6, the pattern of the resist layer 26 is defined to form the source lines that are common to the cells adjacent along the direction of the column lines. In other words, the resist layer 26 is patterned so as not to etch regions for forming the drains and the device isolation regions between the cells adjacent along the direction of the row lines, except the regions for forming the sources.

Figure 7A:
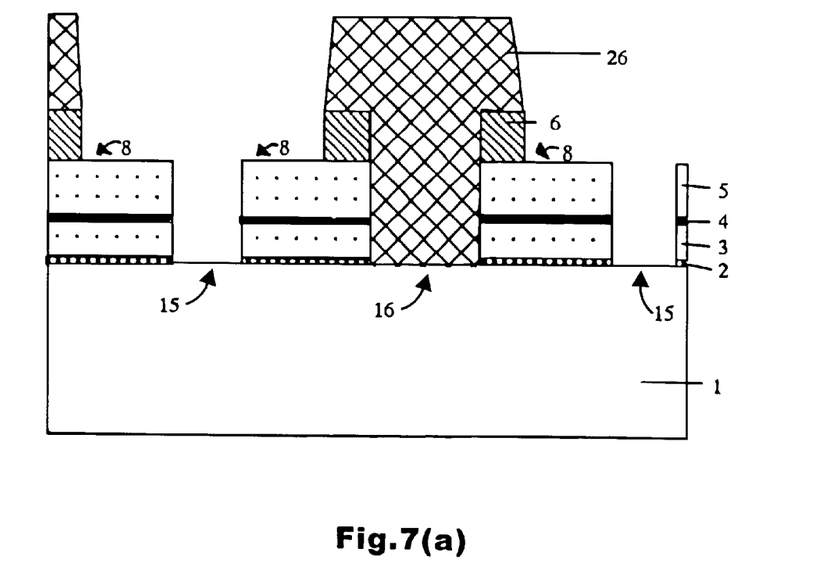
FIGS. 7(a) and 7(b) are schematic sectional views cut along the bit line for illustrating steps of the manufacturing method of the semiconductor device according to the present invention.
Figure 7B:
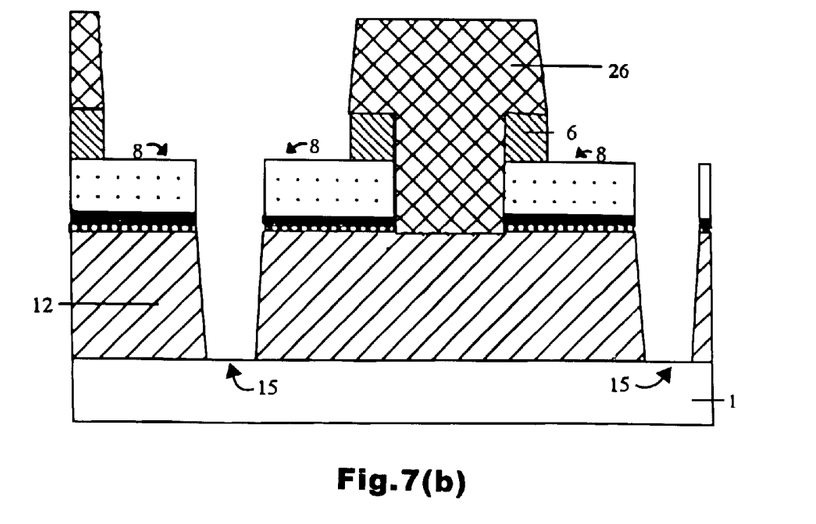

Using the resist layer 26, the device isolation regions 12 exposed in a source forming regions 15 are removed (FIGS. 6, 7(a) and 7(b)). The third insulating films 6 on the control gate silicon films 5 are removed at this time using the control gate silicon films 5 as etch stop layers. Thus, the resist layer 26 for defining the source regions also specifies regions 8 for silicidation on the gate. The third insulating film remaining on the gate electrode preferably has a width of 50 nm to 350 nm in the direction of the channel length.

Figure 8:
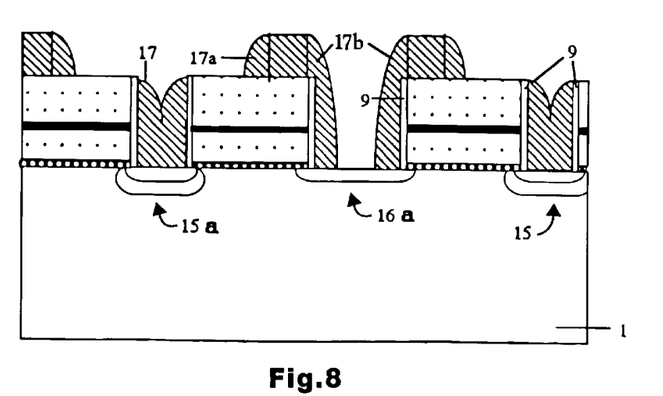
FIG. 8 is a schematic sectional view cut along the bit line for illustrating a step of the manufacturing method of the semiconductor device according to the present invention.

Then, diffusion regions suitable for the source forming regions 15 and the drain forming regions 16 are formed by a known method. Subsequently, a thermal oxidization film 9 (re-oxidization) is thermally grown on each of the sidewalls of the control lines 7 as shown in FIG. 8, so that the control gate silicon films 5 and the floating gate silicon films 3 are insulated from the sources 15a and the drains 16a.

After the re-oxidization, an insulating film such as a silicon nitride film is deposited on the substrate to cover the top and the sidewalls of the control line 7 and subjected to anisotropic etching to form sidewall spacers 17, 17a and 17b. The anisotropic etching is performed until the regions 8 for silicidation on the gates are exposed, therefore the third insulating films 6 on the gates are reduced a little and the sidewall spacers are also formed on the sidewalls thereof.

Figure 9:
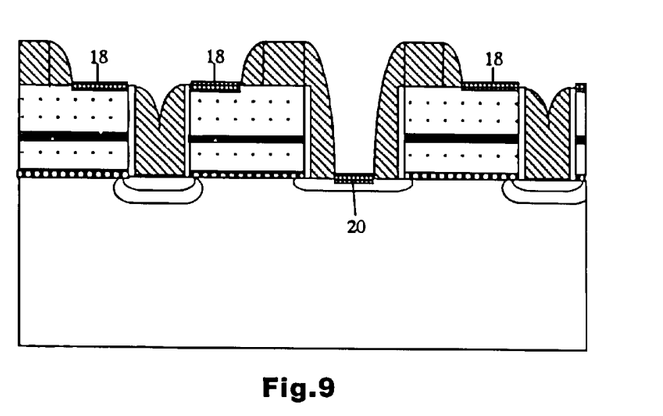
FIG. 9 is a schematic sectional view cut along the bit line for illustrating a step of the manufacturing method of the semiconductor device according to the present invention.

Then, annealing is performed to define the sources 15a and the drains 16a. A refractory metal film (e.g., cobalt or the like) for forming silicide is deposited over the entire surface and a thermal treatment to cause the silicidation is performed (e.g., RTA: Rapid Thermal Anneal). Wet etch using a mixture of sulfuric acid and hydrogen peroxide water is then performed to remove unreacted refractory metal film. Thus, metal silicide layers 18 and 20 are provided on the region 8 for silicidation on the gate electrodes and the drains 16a (FIG. 9).

Figure 10:
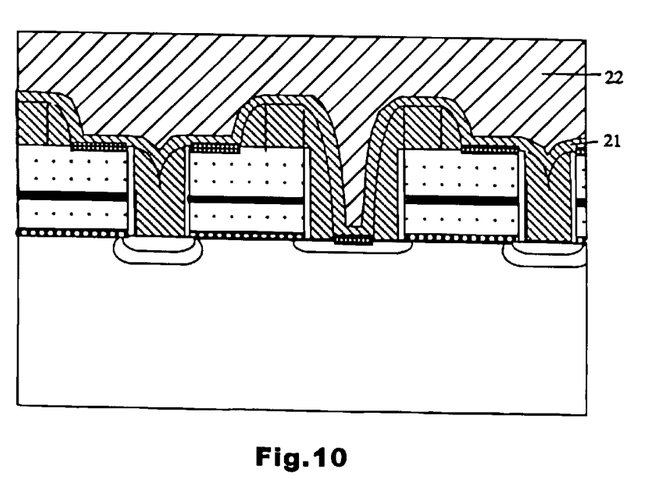
FIG. 10 is a schematic sectional view cut along the bit line for illustrating a step of the manufacturing method of the semiconductor device according to the present invention.
Figure 11:
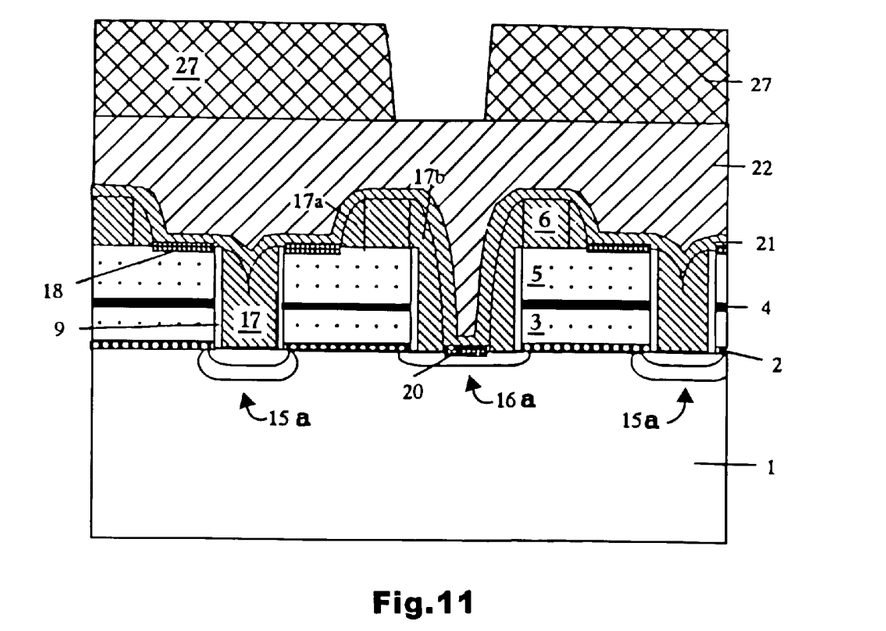
FIG. 11 is a schematic sectional view cut along the bit line for illustrating a step of the manufacturing method of the semiconductor device according to the present invention.
Figure 12:
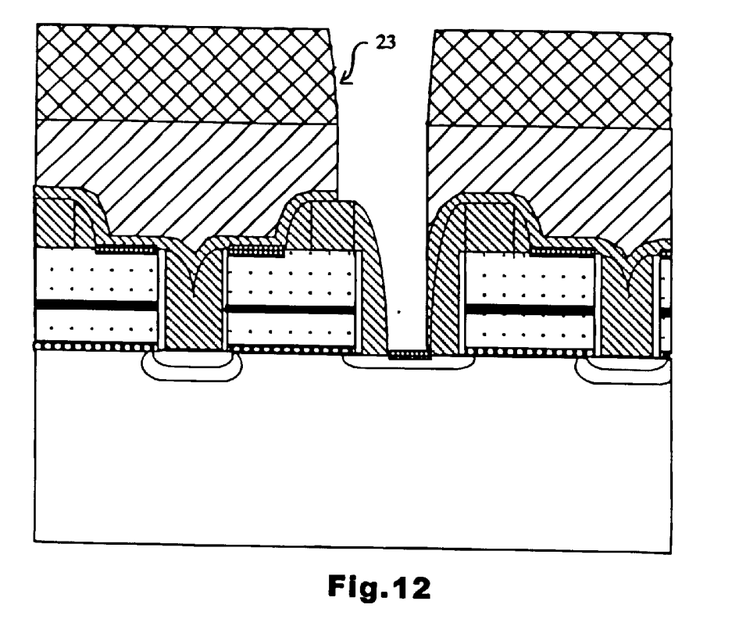
FIG. 12 is a schematic sectional view cut along the bit line for illustrating a step of the manufacturing method of the semiconductor device according to the present invention.

Next, a silicon nitride film 21 is deposited on the silicon substrate to cover the gate electrodes and the like and an interlayer insulating film 22 such as a silicon oxide film is deposited (FIG. 10). Photolithography method and etching method are then performed to open a contact hole 23 in the interlayer insulating film 22 (FIGS. 11 and 12).

The etching process is performed using a resist layer 27 so that the interlayer insulating film 22 of a silicon oxide film is selectively removed with respect to the sidewall spacers 17, 17a and 17b of the silicon nitride films, the third insulating film 6 on the gate electrode and the silicon nitride film 21 until the top of the silicon nitride film 21 is exposed. Thereafter, the silicon nitride film 21 is etched selectively with respect to the metal silicide film until the metal silicide film is exposed. After the etching, the resist layer 27 is removed.

Then, a plug 10 made of tungsten or the like is introduced into the contact hole 23 by a known method to complete the nonvolatile semiconductor memory shown in FIG. 1.

Figure 14:
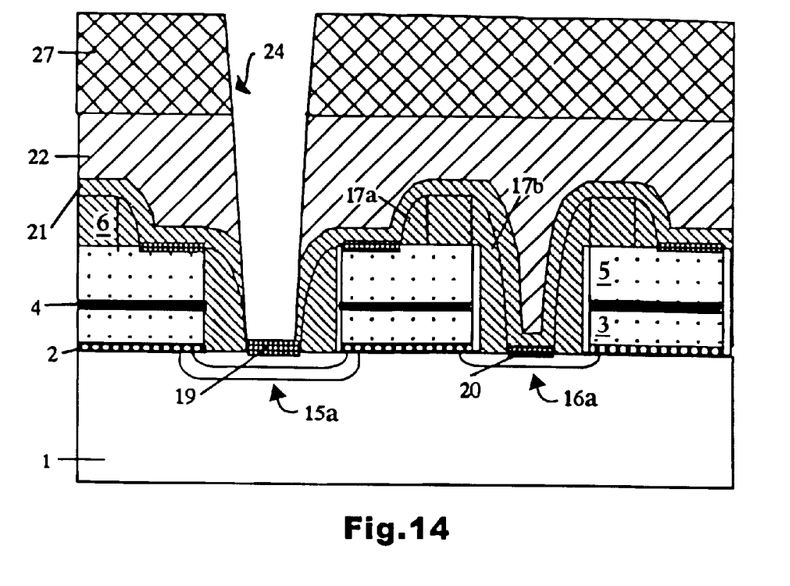
FIG. 14 is a schematic sectional view cut along the bit line of the semiconductor device which can be obtained by the manufacturing method according to the present invention.

FIG. 1 shows an example in which the contact hole is not formed above the source, but it is also possible to form the contact hole 24 on the source as shown in FIG. 14.

According to the present invention, the insulating film region can be provided on the gate electrode without any additional masking step, and the metal silicide layers can be simultaneously formed on the gate electrode and the silicon substrate by the silicidation. The top of the metal silicide layer on the gate electrode is located lower than the top of the insulating film region on the gate electrode and the insulating film is made of the silicon nitride film, so that short circuit between the contact part formed in the contact hole and the gate electrode (in particular the silicide portion) can be avoided even if the self-aligned contact hole overlaps the gate electrode. Accordingly, a process tolerance can be large ensured between the contact part and the gate electrode (in particular the silicide portion) so that leak current can be inhibited.

Further, since the present invention employs the self-aligned silicide technique, the insulating film on the gate electrode can be formed of a silicon nitride film. Therefore, the process tolerance of the contact hole formed by etching according to the self-aligned contact etching technique can be large ensured. Further, even if the size of the drain region is reduced due to the device miniaturization, the region for silicidation on the drain region can be ensured by reducing the width of the sidewall spacers since the sidewall spacers are formed of a silicon nitride film.

What is claimed is:

1. A method of manufacturing a semiconductor device comprising:

(a) forming a first gate insulating film, a floating gate silicon film, a second insulating film between gates, and a control gate silicon film in this order on a silicon substrate and forming thereon a third insulating film;

(b) etching said films until the silicon substrate is exposed to form a gate electrode and to open regions for a source and a drain;

(c) removing a portion of the third insulating film from on at least a portion of a top of the gate electrode while leaving a remaining part of the third insulating film on one top end or both top ends of the gate electrode in the direction of channel length so that the control gate silicon film is only partially exposed at the top of the gate electrode;

(d) forming sidewall spacers on sidewalls of the gate electrode and the third insulating film remaining on top of the gate electrode;

(e) depositing a refractory metal film;

(f) performing a thermal treatment for silicidation of the refractory metal film to form a metal silicide layer on each of the exposed control gate silicon film and the silicon substrate; and providing a device isolation region in the silicon substrate for separating active regions prior to the step (a), wherein the device isolation region on the region for forming the source is removed and a region for forming the metal silicide layer on the control gate silicon film is defined at the same time when the third insulating film is removed in the step (c).

2. A method according to claim 1, wherein the removal of the third insulating film and the removal of the device isolation region on the region for forming the source in the step (c) are performed selectively with respect to the control gate silicon film and the silicon substrate.

3. A method according to claim 1, wherein the third insulating film and the sidewall spacers are formed of a silicon nitride film.

4. A method according to claim 1, wherein the third insulating film remaining on the gate electrode has a width of 50 nm to 350 nm in the direction of the channel length.

5. A method of making a semiconductor device, the method comprising:

forming a first gate insulating film, a floating gate film, a second insulating film, a control gate film, and a third insulating film on a substrate comprising silicon;

patterning said first gate insulating film, said floating gate film, said second insulating film, and said control gate film in order to form a gate electrode;

removing a portion of the third insulating film from a top surface of the gate electrode while leaving another portion of the third insulating film on the top surface of the gate electrode so that the control gate film is only partially exposed at the top of the gate electrode;

forming sidewall spacers on sidewalls of the gate electrode and the portion of the insulating film remaining on the gate electrode so that at least a portion of at least one sidewall spacer is formed on the top of the gate electrode;

depositing a refractory metal film;

performing a thermal treatment for silicidation of the refractory film in order to form a metal silicide on the exposed top portion of the gate electrode and on a portion of the silicon substrate over a source or drain region; and providing a device isolation region in the silicon substrate for separating active regions prior to the step of forming a first gate insulating film, wherein the device isolation region on the region for forming the source is removed and a region for forming the metal silicide layer on the control gate silicon film is defined at the same time when the third insulating film is removed in the step of removing a portion of the third insulating film.

6. The method of claim 5, further comprising forming a silicon nitride layer and an interlayer insulator over the metal silicide, and patterning the silicon nitride layer and the interlayer insulator in order to form at least one contact hole therein.

7. The method of claim 6, further comprising forming a conductive plug in the contact hole.

8. The method of claim 5, wherein the sidewall spacers and the third insulating film comprise silicon nitride.

* * * * *